(12) United States Patent
Ruszowski

(10) Patent No.: US 7,851,255 B2
(45) Date of Patent: Dec. 14, 2010

(54) PLACEMENT OF AN INTEGRATED CIRCUIT

(76) Inventor: Czeslaw Andrzej Ruszowski, R.R.#7, Box 7208, Moscow, PA (US) 18444

( * ) Notice: Subject to any disclaimer, the term of this patent is extended or adjusted under 35 U.S.C. 154(b) by 0 days.

(21) Appl. No.: 12/195,441

(22) Filed: Aug. 21, 2008

(65) Prior Publication Data

US 2010/0047961 A1  Feb. 25, 2010

(51) Int. Cl.
*H01L 21/00* (2006.01)
(52) U.S. Cl. ............... 438/107; 438/106; 438/125; 438/129; 257/E21.499; 257/E21.511; 257/E21.705
(58) Field of Classification Search ............... 438/965; 257/E21.003, E21.087, E21.5
See application file for complete search history.

(56) References Cited

U.S. PATENT DOCUMENTS

| 2001/0016435 A1 | 8/2001 | Fujimura | |
| 2003/0111727 A1* | 6/2003 | Kurusu | 257/730 |
| 2004/0169275 A1* | 9/2004 | Danvir et al. | 257/737 |
| 2006/0118971 A1 | 6/2006 | Gracias | |

FOREIGN PATENT DOCUMENTS

| JP | 58121654 A | 7/1983 |
| JP | 62018722 A | 1/1987 |

* cited by examiner

*Primary Examiner*—Walter L Lindsay, Jr.
*Assistant Examiner*—Cheung Lee
(74) *Attorney, Agent, or Firm*—Ash Tankha

(57) ABSTRACT

Disclosed herein is a method of positioning and placing an integrated circuit on a printed circuit board. The integrated circuit comprises first geometrical elements. The first geometrical elements are of one or more predefined shapes and are located on one or more predefined surfaces of the integrated circuit. The printed circuit board comprises second geometrical elements. The second geometrical elements are shaped to accommodate the first geometrical elements. The first geometrical elements are designed to fit into the second geometrical elements. The first geometrical elements are positioned and placed over the second geometrical elements. The first geometrical elements come in contact with the second geometrical elements at two or more points. The positioning and placement of the first geometrical elements over the second geometrical elements limits displacement of connections of the integrated circuit from the printed circuit board.

11 Claims, 2 Drawing Sheets

PLACEMENT OF AN INTEGRATED CIRCUIT

CROSS REFERENCE TO RELATED APPLICATIONS

This application claims the benefit of non-provisional patent application number P 384063, titled "Means of positioning the enclosure of an electronic component, especially integrated circuit constructed as single layer, multi-layer or as a stacked package on silicon (Si) or ceramic substrates types: IC, SiP or MCM", filed on Dec. 17, 2007 in the Polish Patent Office.

BACKGROUND

This invention, in general, relates to integrated circuits. More particularly, this invention relates to positioning and placing of the integrated circuit (IC) with leads or lead-less, hybrid circuits (HC), system in package (SIP), and multi-chip module (MCM) on the corresponding pads of a printed circuit board (PCB) or other substrate.

Shape or particular characteristics of the package of an IC, HC, SIP, or MCM package including the way the IC package is manufactured is based on simple and precise positioning of the package on the PCB during assembly or service.

At present expensive and high precision pick and place machines are used to position the IC package above corresponding pattern of connections on the PCB and to position the IC correctly and to solder the IC to the PCB. The placement accuracy of the IC is dependant on precision of the positioning or placing machine, and also dependant on the machine operator.

To establish a position metrology based on precision, optics and mechanics is used in conjunction with graphical two or three dimensional elements on the PCB which are not directly related to the IC package, or with IC connections and their matching equivalents such as the pads placed on the PCB.

The quantity of elements participating in the positioning process and variety of external conditions results in inaccurate positioning.

Hence, there is a need for a method to position and place the IC over the PCB without using expensive pick and place machines.

DETAILED DESCRIPTION OF THE INVENTION

Figure 1:
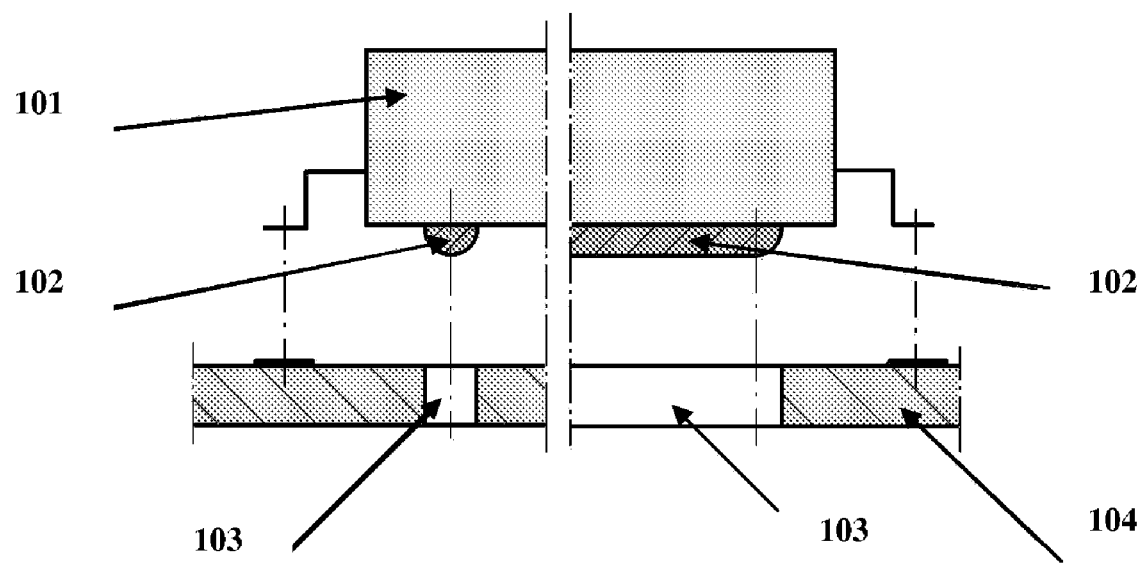
FIG. 1 illustrates a method of placing geometrical elements of an integrated circuit and a printed circuit board as described in Example 1.

Disclosed herein is an integrated circuit (IC) package comprising first geometrical elements 102 that represent a unique rotation pattern. The IC package is placed during assembly in such a way that the first geometrical elements 102 fit into corresponding second geometrical elements 103 on a printed circuit board (PCB) 104. The corresponding second geometrical elements 103 on the PCB 104 are a reversed pattern of the first geometrical elements 102 on the IC 101. The method of placing geometrical elements of the IC 101 over the PCB 104 is exemplarily illustrated in FIG. 1.

The first geometrical elements 102 on the IC package and the reversed second geometrical elements 103 on the PCB 104 are constructed in such a way that they touch each other in at least two resistance points and in particular cases touch each other's surface, limiting movement of the IC 101 in a plane of the PCB 104 or other surface on which the IC 101 was going to be placed, that is, limiting the IC 101 movement in any direction on the PCB 104.

The tolerance of the dimensions of the first geometrical elements 102 defining the accuracy of their fit is in direct relationship to the required accuracy and tolerance of placement of the IC 101 on the PCB 104.

The first geometrical elements 102 on the IC 101 and the reversed second geometrical elements 103 on the PCB 104 are placed on the IC 101 and on the PCB 104 so that the proper fit of the first geometrical elements 102 is possible in one position of the IC 101 in relationship to the PCB 104.

The pattern of one or more first geometrical elements 102 may be protruding out-wards from the bottom or the sides of the IC 101, if more than one first geometrical elements 102 are chosen, as far as possible away from each other and on the diagonal of the IC 101, while the pattern of the corresponding one ore more second geometrical elements 103 on the PCB 104 is a matching indent or opening in the PCB 104.

The pattern of the one ore more first geometrical elements 102 may be protruding inwards from the bottom or sides of the IC 101, if more than one first geometrical elements 102 are chosen, as far as possible away from each other and on the diagonal of the IC 101, while the pattern of the corresponding one or more second geometrical elements 103 on the PCB 104 is a matching geometrical pattern protruding outwards or sticking out from the PCB 104.

The first geometrical elements 102 intended for precision and defining orientation and accurate placement may be made of materials that conduct electricity and additionally can serve as electrical contacts.

In an embodiment, the first geometrical elements 102 may be a part of a cylinder with semicircular or semispherical ends positioned horizontally and not symmetrically on IC 101 bottom surface. In such a case, the corresponding shape on the PCB 104 will be an elongated opening or hole in the PCB 104, matching the shape of the half cylinder with the semi-circular or semispherical ends.

The geometrical pattern may comprise the two cylinders protruding vertically from the bottom surface of the IC 101, preferably on the opposite sides of the IC 101 on or close to a diagonal. The ends of the cylinders, by design, are conical, angled or rounded to facilitate insertion of the cylinders into matching holes or indents on the PCB 104. In the case of two or more cylinders, the corresponding pattern on the PCB 104 is a set of two or more round holes having diameters and spacing matching the two or more cylinders protruding from the bottom surface or attached to the sides of the IC 101.

The geometrical shape for the pattern may also be an indent in a shape of a cylinder with circular ends placed not centrally on the bottom surface of an integrated circuit. In such a case, the matching pattern on the PCB 104 will be half cylinder placed horizontally and with rounded ends to mach the indent in the IC 101.

The geometrical pattern may be a set of minimum two round indents or holes in the IC 101 in its bottom surface, located by design on the opposite sides and possibly close to, or diagonally on the IC 101. The corresponding, matching pattern on the IC 101 has minimum two cylinders protruding vertically from the PCB 104 with rounded, conical, or angled ends to facilitate the insertion of the IC 101 on the cylinders protruding from the PCB 104. The first geometrical elements 102 may be a combination of one or more protruding elements and indents, and the corresponding second geometrical elements 103 accommodate the protruding elements and the indents.

The method disclosed herein facilitates the placement of an IC 101 of any kind precisely and expediently to match land pattern on the PCB 104, or other substrate in less than a second. The use of the geometrical matching patterns on the bottom or sides of the IC 101 and the PCB 104 eliminates the necessity to use expensive and precise machines like automated or manual pick and place machines. Using the method of the matching geometrical patterns simplifies assembly and service of the PCB's 104 build employing surface mount technology. It makes possible the placement of the IC's 101 by hand, without the use of any machines.

Example 1

Figure 2:
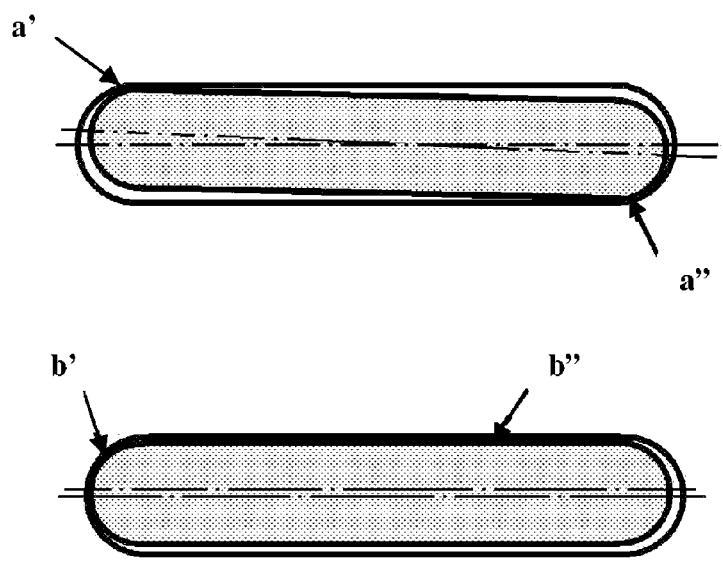
FIG. 2 illustrates contact made by geometrical elements of an integrated circuit and a printed circuit board as described in Example 1.

The overlapping of the IC 101 electrical connections with the corresponding pads on the PCB 104 is performed by matching or inserting the first geometrical elements 102 on the bottom of the IC 101 with the corresponding second geometrical elements 103 on the PCB 104. The first geometrical elements 102 on the bottom of the IC 101 and the second geometrical elements 103 on the PCB 104 are selected in such a way so that when inserted into one another they touch each other in at least two points a', a", and in a particular case touch each other along sides b', b" as illustrated in FIG. 2, thereby limiting displacement in any direction including rotation of the IC 101 when placed on the surface of the PCB 104. The accuracy of dimensions of the first geometrical elements 102 on both IC 101 bottom surface and the corresponding second geometrical elements 103 on the PCB 104 depends directly on the required accuracy of placement of the electrical connections of the IC 101 on the corresponding pads or electrical connections of the PCB 104.

The first geometrical elements 102 on the bottom of the IC 101 and the second geometrical elements 103 on the PCB 104 are made and located so that their correct match is possible only when the IC 101 electrical connections correctly overlap with the corresponding electrical connections, lands, or pads on the PCB 104 on which the IC 101 is placed.

The first geometrical elements 102 may be indents on the bottom of the IC 101 or on its sides located preferably on the IC's 101 opposite sides. The corresponding second geometrical elements 103 on the PCB 104 may protrude upwards and have dimensions and spacing corresponding to dimensions and spacing of the first geometrical elements 102 on the bottom of the IC 101 to fit snugly when the IC 101 is placed correctly on the PCB 104.

The first geometrical elements 102 on the bottom of the IC 101 and the second geometrical elements 103 on the PCB 104 may be made from materials that conduct electricity and may also serve as additional contacts.

In Example 1, the first geometrical elements 102 on the bottom of the IC 101 are in the form of half cylinders with rounded, half circle, or half spherical ends placed horizontally and asymmetrically in relationship to the IC package. In this case, the corresponding second geometrical elements 103 on the PCB 104 are openings or holes or indents in a PCB 104 of corresponding dimensions and locations to the first geometrical elements 102 on the bottom of the IC 101.

Alternatively the first geometrical elements 102 on the bottom of the IC 101 may be openings or holes or indents located asymmetrically on the IC package, and the second geometrical elements 103 on the PCB 104 are in the form of a matching half cylinders with rounded, half circle or half spherical ends placed horizontally on the PCB 104. Furthermore, the first geometrical elements 102 are located in places to assure overlap of the electrical connections of the IC 101 with the corresponding electrical connections on the PCB 104.

Example 2

In this example, the first geometrical elements 102 on the bottom of the IC 101 are in the form of two cylinders protruding vertically downwards from the bottom surface of the IC 101. The first geometrical elements 102 may be located on the IC's 101 opposite sides on or close to diagonal formed by opposite corners of the IC 101 The first geometrical elements 102 are asymmetrically located if the cylinders have the same diameter.

The matching second geometrical elements 103 on the PCB 104 are round openings or holes or indents in a PCB 104 of corresponding dimensions and locations to the first geometrical elements 102 on the bottom of the IC 101. The ends of the cylinders have angled, rounded or conical edges to facilitate a snug fit of the cylinders into corresponding openings or indents in the PCB 104 when IC 101 is placed on the PCB 104.

Figure 3:
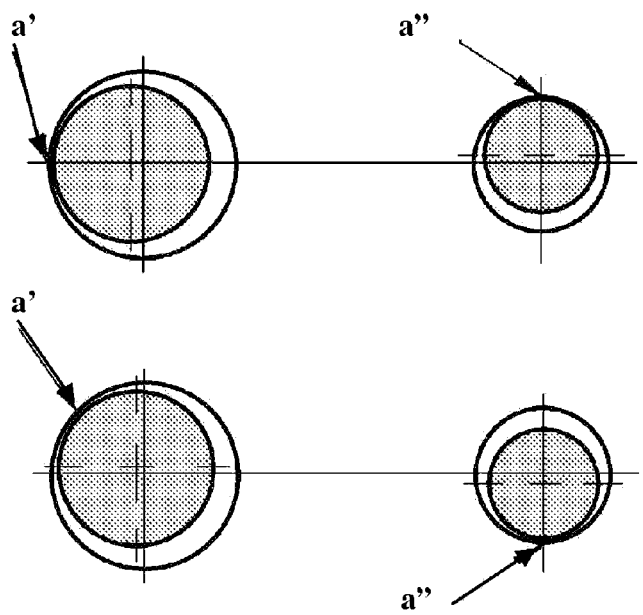
FIG. 3 illustrates contact made by geometrical elements of an integrated circuit and a printed circuit board as described in Example 2.

Alternatively, the first geometrical elements 102 on the bottom of the IC 101 may be round openings, holes, or indents located asymmetrically on the IC package, and the second geometrical elements 103 on the PCB 104 are in the form of matching cylinders with angled, rounded, or conical edges to facilitate a snug fit of the cylinders into corresponding openings or indents on the bottom of IC 101 when the IC 101 is placed on the PCB 104 and located in such places to assure overlap of the electrical connections of the IC 101 with the corresponding electrical connections on the PCB 104. The contact made by geometrical elements of the IC 101 and the PCB 104 as described in example 2 is exemplarily illustrated in FIG. 3.

The IC 101 placement method disclosed herein allows for precise and quick placement of the IC package on the corresponding electrical connections on the PCB 104 and elimination of expensive feeders and positioning jigs or machines.

Implementation of the method disclosed herein simplifies surface mount components placement, facilitates and makes it economical and quicker, especially during processes of low volume production and service of PCB's 104 build using surface mount technology.

I claim:

1. A method of positioning and placing an integrated circuit on a printed circuit board, comprising the steps of:
   providing said integrated circuit comprising first geometrical elements, wherein said first geometrical elements are of one or more predefined shapes and wherein said first geometrical elements are one or more of asymmetrically located and diagonally located on one or more predefined surfaces of the integrated circuit in one of a horizontal orientation, a vertical orientation and a combination thereof with respect to said integrated circuit;
   providing said printed circuit board comprising second geometrical elements, wherein said second geometrical elements are shaped to accommodate the first geometrical elements in one of a horizontal orientation, a vertical orientation, and any combination thereof, wherein one or more of said first geometrical elements and second geometrical elements in said horizontal orientation comprise semicircular or semispherical ends, and wherein one or more of said first geometrical elements and second geometrical elements in said vertical orientation comprise one of conical ends, angled ends and rounded ends;

positioning the one or more of asymmetrically located and diagonally located first geometrical elements over the second geometrical elements; and placing said positioned first geometrical elements over the second geometrical elements, wherein the first geometrical elements come in contact with the second geometrical elements at two or more points, and wherein said predefined shapes and said locations enable a proper fit of the first geometrical elements of the integrated circuit in an unique position of the integrated circuit in relation to the printed circuit board;

whereby said positioning and said placement of the first geometrical elements over the second geometrical elements limit displacement of connections of the integrated circuit from the printed circuit board.

2. The method of claim 1, wherein accuracy of dimensions of the first geometrical elements and the second geometrical elements is directly related to accuracy of placement of electrical connections of the integrated circuit on corresponding electrical connections on the printed circuit board.

3. The method of claim 1, wherein the first geometrical elements are protruding outwards and are diagonally located on said predefined surfaces of the integrated circuit, wherein corresponding second geometrical elements on the printed circuit board are indents or openings of dimensions and spacing for accommodating said diagonally located first geometrical elements.

4. The method of claim 1, wherein the first geometrical elements are indents or openings located on said predefined surfaces of the integrated circuit, wherein corresponding second geometrical elements on the printed circuit board are protruding outwards and have dimensions and spacing for accommodating said indents or said openings associated with the first geometrical elements.

5. The method of claim 1, wherein the first geometrical elements and the second geometrical elements are made of electrically conducting materials, wherein the first geometrical elements and the second geometrical elements can serve as electrical contacts.

6. The method of claim 1, wherein the first geometrical elements is of a half cylindrical shape with semi circular or semi spherical ends located on bottom surface of the integrated circuit, wherein the first geometrical elements are located asymmetrically on the integrated circuit, wherein corresponding second geometrical elements on the printed circuit board are openings or indents of dimensions and spacing for accommodating said asymmetrically located first geometrical elements of said half cylindrical shape.

7. The method of claim 1, wherein the first geometrical elements are of a cylindrical shape with rounded, angled, or conical ends to facilitate matching with corresponding shapes on the printed circuit board, wherein the first geometrical elements are protruding vertically outwards and located on opposite sides of the integrated circuit, wherein corresponding second geometrical elements on the printed circuit board are one or more of round openings of corresponding dimensions and spacing.

8. The method of claim 1, wherein the first geometrical elements are elongated indents or openings with semicircular or semispherical ends placed asymmetrically on bottom surface of the integrated circuit, wherein corresponding second geometrical elements on the printed circuit board are half cylinders with dimensions and spacing for accommodating said elongated indents and openings associated with the first geometrical elements.

9. The method of claim 1, wherein the first geometrical elements are circular indents or openings positioned asymmetrically on bottom surface of the integrated circuit, wherein the first geometrical elements are located on opposite sides of the integrated circuit, wherein corresponding second geometrical elements on the printed circuit board are vertical cylinders along plain of the printed circuit board.

10. The method of claim 1, wherein the first geometrical elements are a combination of one or more protruding elements and indents, wherein the corresponding second geometrical elements accommodate said protruding elements and said indents.

11. A method of positioning and placing an integrated circuit on a printed circuit board, comprising:

providing said integrated circuit comprising first geometrical elements, wherein said first geometrical elements are of one or more predefined shapes, and wherein said first geometrical elements are one or more of asymmetrically located and diagonally located on one or more predefined surfaces of the integrated circuit in a horizontal orientation with respect to said integrated circuit;

providing said printed circuit board comprising second geometrical elements, wherein said second geometrical elements are shaped to accommodate the first geometrical elements in said horizontal orientation;

positioning the one or more of asymmetrically located and diagonally located first geometrical elements over the second geometrical elements; and placing said positioned first geometrical elements over the second geometrical elements, wherein the first geometrical elements come in contact with the second geometrical elements at two or more points, and wherein said predefined shapes and said locations enable a proper fit of the first geometrical elements of the integrated circuit in an unique position of the integrated circuit in relation to the printed circuit board in a horizontal plane;

whereby said positioning and said placement of the first geometrical elements over the second geometrical elements limit displacement of connections of the integrated circuit from corresponding connections on the printed circuit board.

* * * * *